(12) United States Patent
Yi

(10) Patent No.: US 6,625,067 B2
(45) Date of Patent: Sep. 23, 2003

(54) SEMICONDUCTOR MEMORY DEVICE FOR VARIABLY CONTROLLING DRIVABILITY

(75) Inventor: Seung-Hyun Yi, Ichon (KR)

(73) Assignee: Hynix Semiconductor Inc., Ichon-shi (KR)

(*) Notice: Subject to any disclaimer, the term of this patent is extended or adjusted under 35 U.S.C. 154(b) by 0 days.

(21) Appl. No.: 10/029,947

(22) Filed: Dec. 31, 2001

(65) Prior Publication Data

US 2002/0085427 A1 Jul. 4, 2002

(30) Foreign Application Priority Data

Dec. 30, 2000 (KR) .......................................... 2000-87072

(51) Int. Cl.⁷ .............................................. G11C 16/04
(52) U.S. Cl. ........................... 365/189.05; 365/230.02; 365/230.03; 365/230.06
(58) Field of Search ....................... 365/189.05, 230.03, 365/230.02, 230.06

(56) References Cited

U.S. PATENT DOCUMENTS

| 6,351,427 | B1 | * | 2/2002 | Brown ................... 365/230.03 |
| 6,430,092 | B2 | * | 8/2002 | Nanba ................... 365/189.11 |
| 2002/0024882 | A1 | * | 2/2002 | Ikeda ......................... 365/233 |
| 2002/0071316 | A1 | * | 6/2002 | Manning ............... 365/189.05 |
| 2002/0105836 | A1 | * | 8/2002 | Benedix ................ 365/189.05 |

* cited by examiner

Primary Examiner—Richard Elms
Assistant Examiner—Toan Le
(74) Attorney, Agent, or Firm—Jacobson Holman PLLC

(57) ABSTRACT

A semiconductor memory device including an N-bit prefetch unit, a plurality of data output drivers to output data from the N-bit prefetch unit and a control signal generator for generating a plurality of control signals in response to command signals, wherein the plurality of data output drivers are driven by the control signals.

13 Claims, 5 Drawing Sheets

US 6,625,067 B2

SEMICONDUCTOR MEMORY DEVICE FOR VARIABLY CONTROLLING DRIVABILITY

FIELD OF THE INVENTION

The present invention relates to a semiconductor memory device and, more particularly, to a synchronous semiconductor memory device capable of variably controlling drivability of a memory.

DESCRIPTION OF THE PRIOR ART

Generally, in a module using a plurality of memories, the drivability of a memory is a more important factor than noise such that drivability is desirable. On the other hand, in a single memory, such as a memory for graphics, the noise of the memory is more important than drivability so that low drivability is required in order to reduce the noise. Accordingly, since there are various usages of memory, a memory having various kinds of drivability is desirable. When the memories are applied to various memory devices, the noise and the drivability are the most important factors. Drivability, representing current sourcing ability, of a data output driver depends on the size of the data output driver. As the width of a MOS transistor including the output driver becomes wider, high drivability has been secured.

But, since the drivability of the memory is fixed in a conventional memory fabricating process, there is a problem in that the memory cannot be variously applied. Namely, when a memory is fabricated for graphics, requiring low drivability, the memory cannot be used in a module using many memories. Conversely, when a memory is fabricated for a module using many memories, the high drivability is required so that noise, due to the high drivability, is highly generated. Accordingly, the memory cannot be used for graphics.

SUMMARY OF THE INVENTION

It is, therefore, an object of the present invention to provide a semiconductor memory device capable of variably controlling drivability of a data output driver.

In accordance with an aspect of the present invention, there is provided a semiconductor memory device comprising an N-bit prefetch unit; a plurality of data output drivers to output data from the N-bit prefetch unit; and a control signal generating means for generating a plurality of control signals in response to command signals, wherein the plurality of data output drivers are driven by the control signals.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE PREFERRED EMBODIMENTS

Hereinafter, a semiconductor memory device according to the present invention will be described in detail referring to the accompanying drawings.

Figure 1:
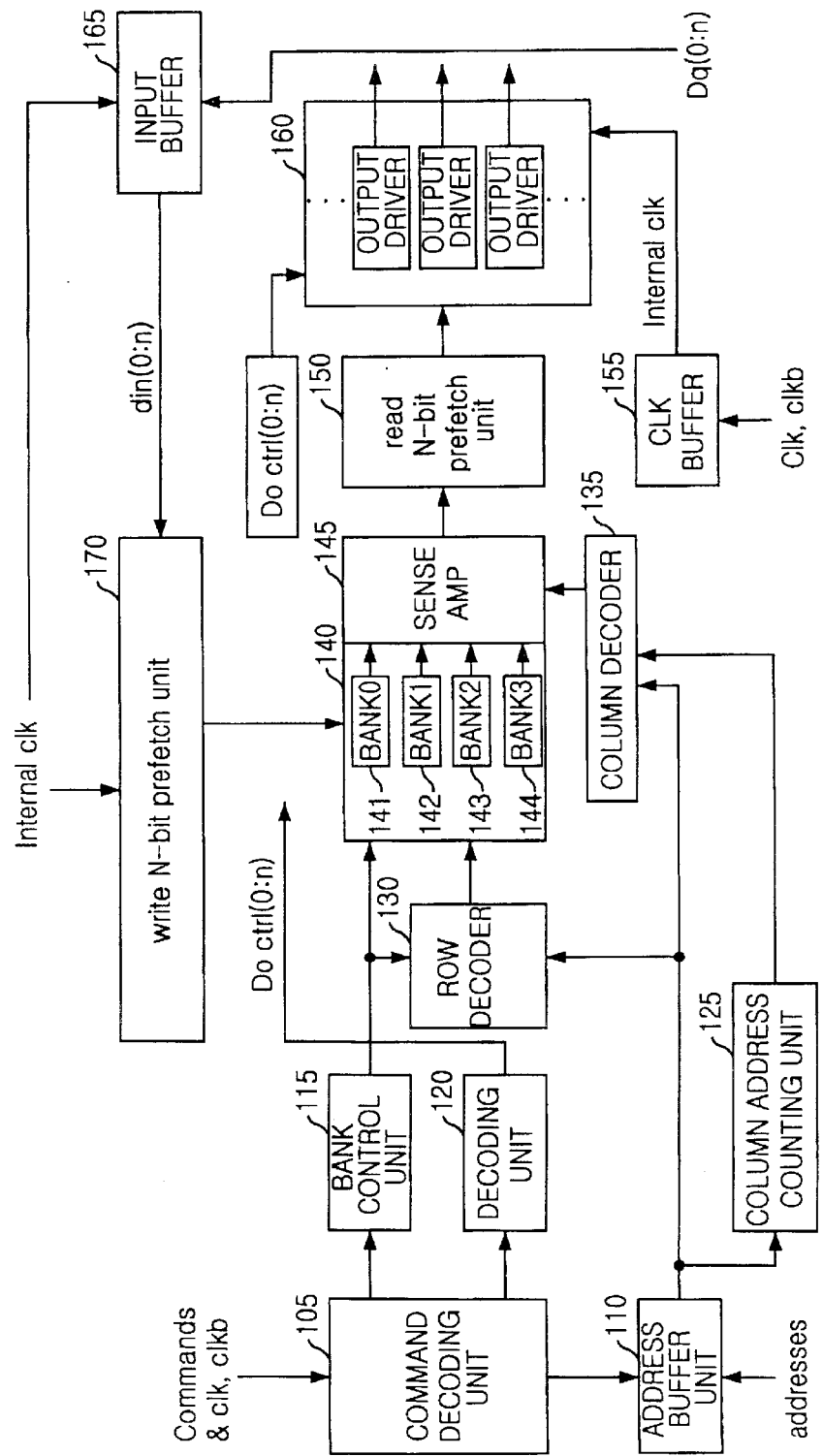
FIG. 1 is a block diagram illustrating a memory configuration for variably controlling drivability of a data output driver according to the present invention.

FIG. 1 is a block diagram illustrating a memory configuration for variably controlling drivability of a data output driver according to the present invention.

Hereinafter, since the operation and configuration of the memory according to the present invention are similar to the conventional synchronous DRAM, an operation and configuration of a general synchronous DRAM will be described.

When command signals and clock signals (clk and clkb) are inputted into a command decoding unit 105, the command signals are synchronized with the clock signals and then the command signals are outputted into a bank control unit 115, a decoding unit 120 and an address buffer unit 110. The bank control unit 115 controls each bank 141, 142, 143 and 144 and a row decoder 130 in response to the command signals. The decoding unit 120 is set by combining the command signals synchronized with the clock signals before a memory is accessed for read or write. Address signals outputted from an address buffer unit 110 are inputted into the row decoder 130, a column decoder 135 and a column address counting unit 125. Data signals read out from each bank 141, 142, 143 and 144 are amplified in a sense amplifier 145 and inputted into the read N-bit prefetch unit 150. The data signals in the read prefetch unit 150 are inputted into an output driver unit 160 with internal clock signals outputted from a clock buffer 155. Also, the internal clock signals are inputted into the write prefetch unit 170 and an input buffer unit 165. The data signals outputted from the input buffer 165 are stored in synchronization with the internal clock signals in each bank of the bank unit 140 by passing through the write N-bit prefetch unit 170, which has already been set.

The configuration of the memory according to the present invention is similar to the general synchronous DRAM. The difference is that a data output driver control signal (Do ctrl (0:n)) is additionally applied in the output driver 160 according to the present invention. The data output driver unit 160 includes a plurality of data output drivers. One output driver includes a pair of pull-down MOS transistors and a pair of pull-up MOS transistors, and the plurality of data output drivers are connected in parallel. The data output driver control signal, which is applied to the data output driver unit 160, determines the drivability of the data output driver unit 160. Namely, the data output driver control signal controls the number of data output drivers to be enabled. When the number of data output drivers enabled in response to the data output driver control signal is increased, the drivability of the data output driver unit 160 is increased.

The decoding unit 120 receives the command signals and outputs the data output driver control signal (Do ctrl (0:n)) in response to the clock signals (clk and clkb).

Since $\log_2(N)$ numbers of data output driver control signals are required in order to control N numbers of data output drivers, a plurality of data output driver control signals are employed. For example, when there are eight data output drivers, from one to eight data output drivers can be enabled in response to three data output driver control signals. If the decoding unit 120 receives the command signals and the clock signals before write and read operations are performed in the memory, the write and read operations of the memory can be performed without any trouble during a power up operation.

Figure 2A:
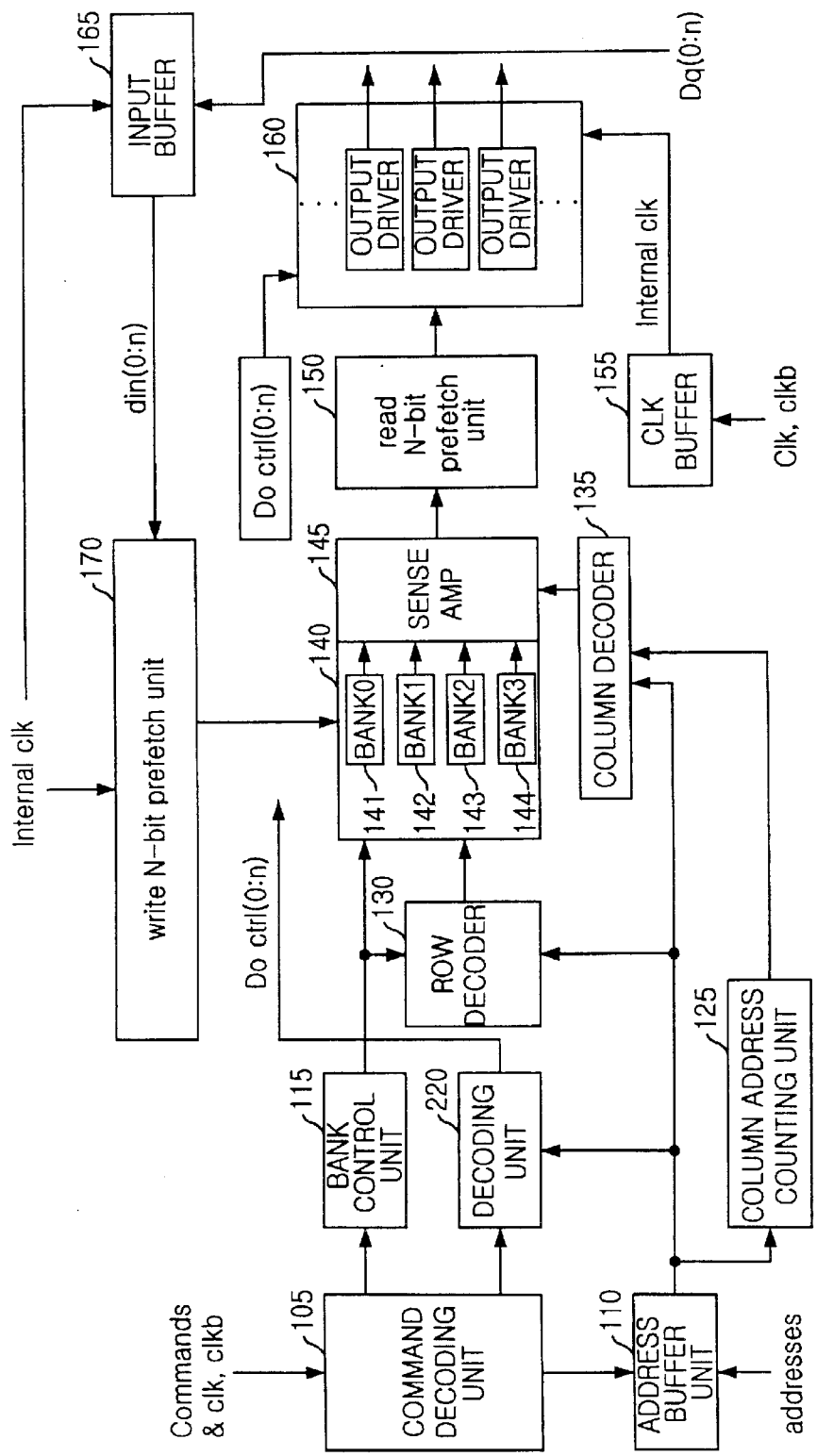
FIG. 2A is a block diagram illustrating a memory configuration for variably controlling drivability of a data output driver according to a second embodiment of the present invention.

FIG. 2A is a block diagram illustrating a memory configuration for variably controlling drivability of the data output driver according to a second embodiment of the present invention.

A difference between the second and third embodiments is that the decoding unit 220, in FIG. 2, further receives address signals outputted from the address buffer unit 110 to generate the data output driver control signal (Do ctrl(0:n)).

Figure 2B:
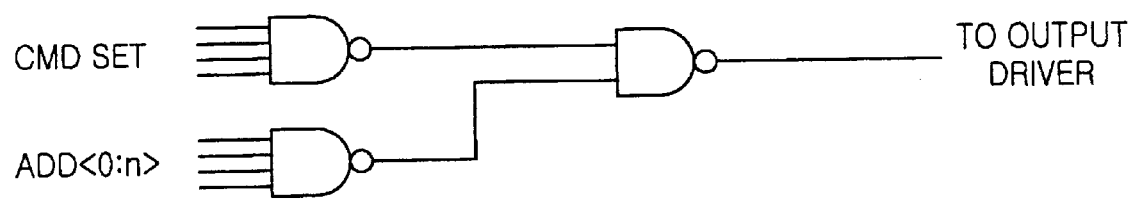
FIG. 2B is a circuit diagram showing the decoding unit of FIG. 2A according to the present invention.

FIG. 2B is a circuit diagram showing the decoding unit of FIG. 2A according to the present invention.

Figure 3:
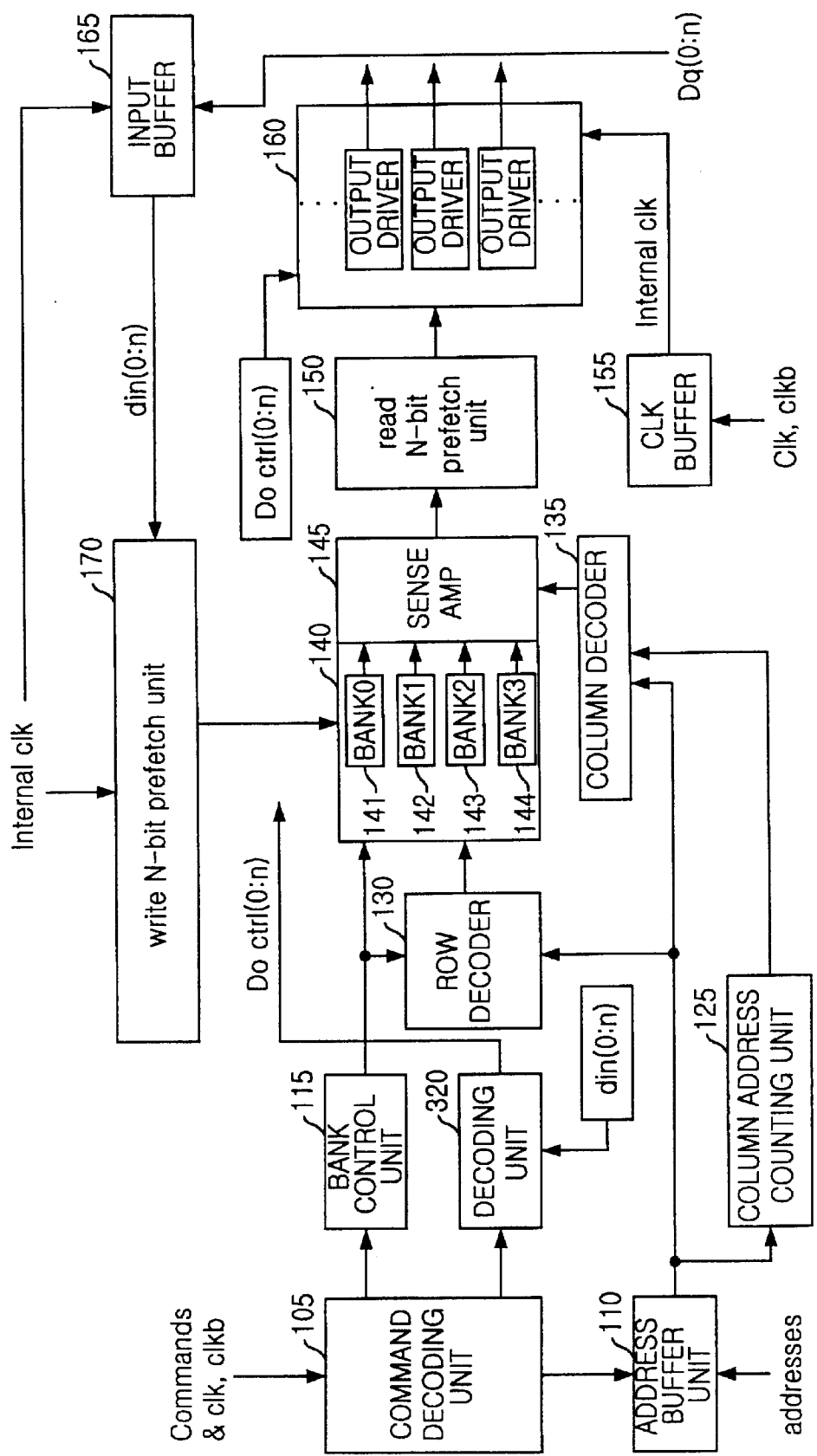
FIG. 3 is a block diagram illustrating a memory configuration for variably controlling drivability of a data output driver according to a third embodiment of the present invention.

FIG. 3 is a block diagram illustrating a memory configuration for variably controlling drivability of the data output driver according to a third embodiment of the present invention.

The memory configuration of the third embodiment of the present invention is similar to the second embodiment except for a signal inputted into the decoding unit 320 so that an explanation of the whole configuration will not be described.

The difference between the second and third embodiments of the present invention is that signals applied to the decoding units 220 and 320 are different in order to generate the data output driver control signal (Do ctrl (0:n)). Namely, the decoding unit 320 in FIG. 3 receives the command signals and data input signals (Din (0:n)) and outputs the data output driver control signal in response to the clock signals.

Figure 4:
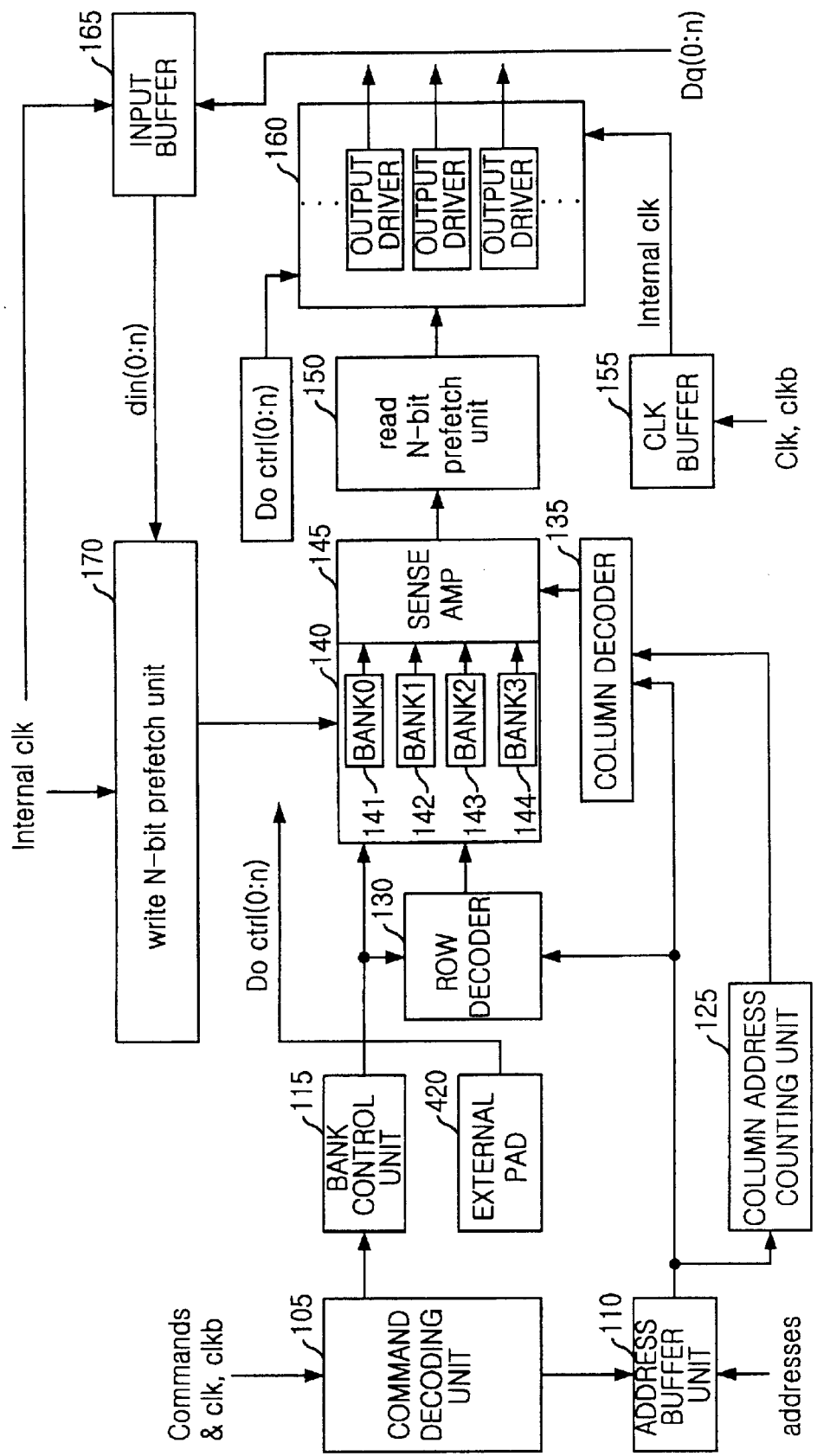
FIG. 4 is a block diagram illustrating a memory configuration for variably controlling drivability of a data output driver according to a fourth embodiment of the present invention.

FIG. 4 is a block diagram illustrating a memory configuration for variably controlling drivability of the data output driver according to a fourth embodiment of the present invention.

In order to generate the data output driver control signal (Do ctrl (0:n)) in the fourth embodiment of the present invention, the decoding unit is not used, but an external pad 420 is employed to generate the data output driver control signal. The external pad represents a physical region corresponding to wires between a chip of a semiconductor, such as an integrated circuit, transistors or the like, and an external circuit. As drain voltage Vdd or source voltage Vss are bonded to the external pad 420, a data output driver control signal having a specific value can be obtained.

The mentioned techniques used for variably controlling the drivability of the data output driver can be applied not only to the synchronous DRAM, but also to an integrated circuit having cells.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device comprising:
    an N-bit prefetch unit for generating data;
    a data output driver nit including a plurality of data output drivers for outputting data received from the N-bit prefetch unit, said data output driver unit having a variable drivability; and
    a control signal generating means for generating a plurality of control signals in response to command signals, a variable number of said plurality of data output drivers being enabled to output said data as determined by the plurality of control signals such that increasing the number of data output drivers enabled by said control signals increases a drivability of said data output driver unit.

2. The semiconductor memory device as recited in claim 1, wherein the control signal generating means includes a logic circuit for combining the command signals.

3. The semiconductor memory device as recited in claim 2, wherein the control signal generating means further includes a logic circuit for combining row address signals.

4. The semiconductor memory device as recited in claim 2, wherein the control signal generating means further includes a logic circuit for combining input data signals.

5. The semiconductor memory device as recited in claim 3, wherein the number of data output drivers is N and the number of control signals is $\log_2 (N)$.

6. The semiconductor memory device as recited in claim 1, wherein the control signal generating means includes a decoding unit for receiving the command signals and outputting the plurality of control signals in response to a clock signal.

7. The semiconductor memory device as recited in claim 6, wherein the decoding unit further receives address signals.

8. The semiconductor memory device as recited in claim 1, wherein the control signal generating means further includes a second decoding unit for receiving data input signals and for outputting the plurality of control signals.

9. The semiconductor memory device as recited in claim 1, wherein the plurality of control signals are provided by an external controller via a pad.

10. A semiconductor memory device comprising:
    an N-bit prefetch unit;
    a data output driver nit having a plurality of data output drivers to output data received from the N-bit prefetch unit; and
    a control signal generating means for generating a plurality of control signals in response to command signals, the plurality of data output drivers being driven by the plurality of control signals, said control signal generating means including a logic circuit for combining input data signals.

11. The semiconductor memory device as recited in claim 10, further comprising a logic circuit for combining the command signals.

12. The semiconductor memory device as recited in claim 10, wherein the number of data output drivers is N and the number of control signals is $\log_2(N)$.

13. A semiconductor memory device comprising:
    an N-bit prefetch unit;
    a data output driver unit having a plurality of data output drivers to output data received from the N-bit prefetch unit; and
    a control signal generating means for generating a plurality of control signals in response to command signals, the plurality of data output drivers being driven by the plurality of control signals, said control signal generating means including a decoding unit for receiving data input signals and for outputting the plurality of control signals.

* * * * *